US008890269B2

(12) United States Patent
Luan

(10) Patent No.: US 8,890,269 B2
(45) Date of Patent: Nov. 18, 2014

(54) OPTICAL SENSOR PACKAGE WITH THROUGH VIAS

(75) Inventor: Jing-En Luan, Shenzhen (CN)

(73) Assignee: STMicroelectronics Pte Ltd., Singapore (SG)

(*) Notice: Subject to any disclaimer, the term of this patent is extended or adjusted under 35 U.S.C. 154(b) by 0 days.

(21) Appl. No.: 13/485,624

(22) Filed: May 31, 2012

(65) Prior Publication Data

US 2013/0320471 A1 Dec. 5, 2013

(51) Int. Cl.
| H01L 31/18 | (2006.01) |
| H01L 31/0232 | (2014.01) |
| H01L 27/146 | (2006.01) |

(52) U.S. Cl.
CPC .... *H01L 27/14625* (2013.01); *H01L 27/14618* (2013.01)
USPC .................................. 257/434; 257/E31.127

(58) Field of Classification Search
CPC .................... H01L 27/14625; H01L 27/14618
USPC ........................................... 257/434, E31.127
See application file for complete search history.

(56) References Cited

U.S. PATENT DOCUMENTS

| 6,177,724 | B1 | 1/2001 | Sawai | |
| 6,870,238 | B2 * | 3/2005 | Exposito et al. | 257/431 |
| 7,668,449 | B2 | 2/2010 | Saugier et al. | |
| 7,851,880 | B2 * | 12/2010 | Suzuki et al. | 257/448 |
| 7,939,361 | B2 * | 5/2011 | Honda | 438/64 |
| 2002/0048845 | A1 | 4/2002 | Barrett | |
| 2009/0179290 | A1 * | 7/2009 | Shuangwu et al. | 257/434 |
| 2010/0174969 | A1 | 7/2010 | Ashe et al. | |
| 2011/0156250 | A1 | 6/2011 | Goh et al. | |
| 2011/0157452 | A1 | 6/2011 | Goh et al. | |
| 2012/0161332 | A1 | 6/2012 | Chua et al. | |
| 2012/0282767 | A1 | 11/2012 | Jin et al. | |

OTHER PUBLICATIONS

Jin, "Semiconductor Package with Improved Pillar Bump Process and Structure," U.S. Appl. No. 13/232,780, filed Sep. 4, 2011, 24 pages.
Jin et al., "Land Grid Array Semiconductor Package and Method of Manufacture," U.S. Appl. No. 13/287,816, filed Nov. 2, 2011, 24 pages.
Gan et al., "Embedded Wafer Level Package for 3D and Package-on-Package Applications, and Method of Manufacture," U.S. Appl. No. 13/287,826, filed Nov. 2, 2011, 22 pages.
Gan et al., "Embedded Wafer Level Package for 3D and Package-on-Package Applications, and Method of Manufacture," U.S. Appl. No. 13/312,562, filed Dec. 6, 2011, 40 pages.

* cited by examiner

*Primary Examiner* — Kimberly Rizkallah
*Assistant Examiner* — Alexander Belousov
(74) *Attorney, Agent, or Firm* — Seed IP Law Group PLLC

(57) ABSTRACT

A wafer-level camera sensor package includes a semiconductor substrate with an optical sensor on a front surface. Through-silicon-vias (TSV) extend through the substrate and provide I/O contact with the sensor from the back side of the substrate. A glass cover is positioned over the front surface, and the cover and substrate are embedded in a molding compound layer (MCL), the front surface of the MCL lying coplanar with the front of the cover, and the back surface lying coplanar with the back of the substrate. Surface-mount devices, electromagnetic shielding, and through-wafer-connectors can be embedded in the MCL. A redistribution layer on the back surface of the MCL includes bottom contact pads for mounting the package, and conductive traces interconnecting the contact pads, TSVs, surface-mount devices, shielding, and through-wafer-connectors. Anisotropic conductive adhesive is positioned on the front of the MCL for physically and electrically attaching a lens array.

17 Claims, 9 Drawing Sheets

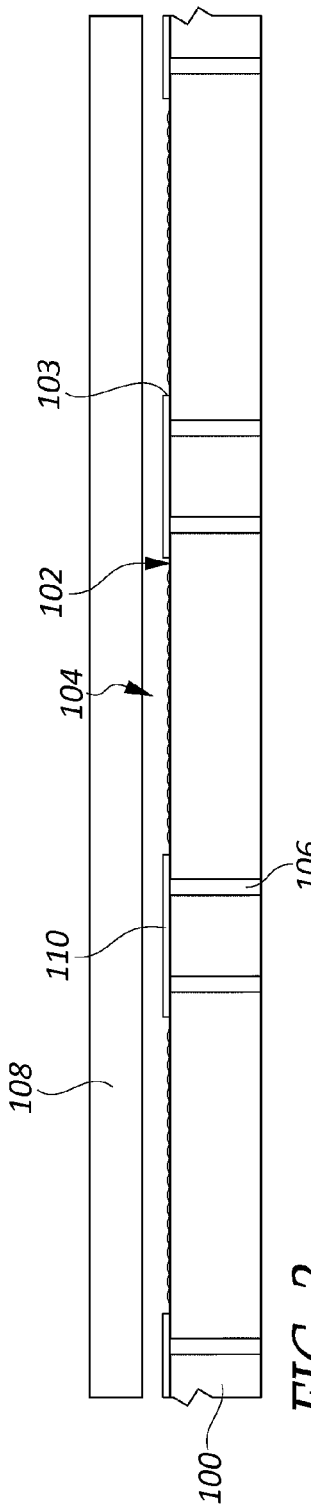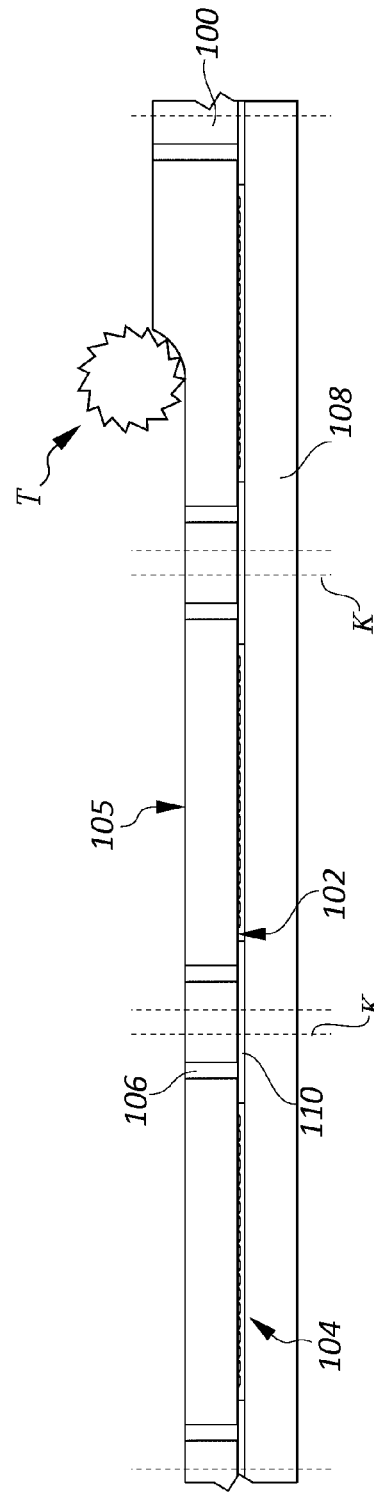

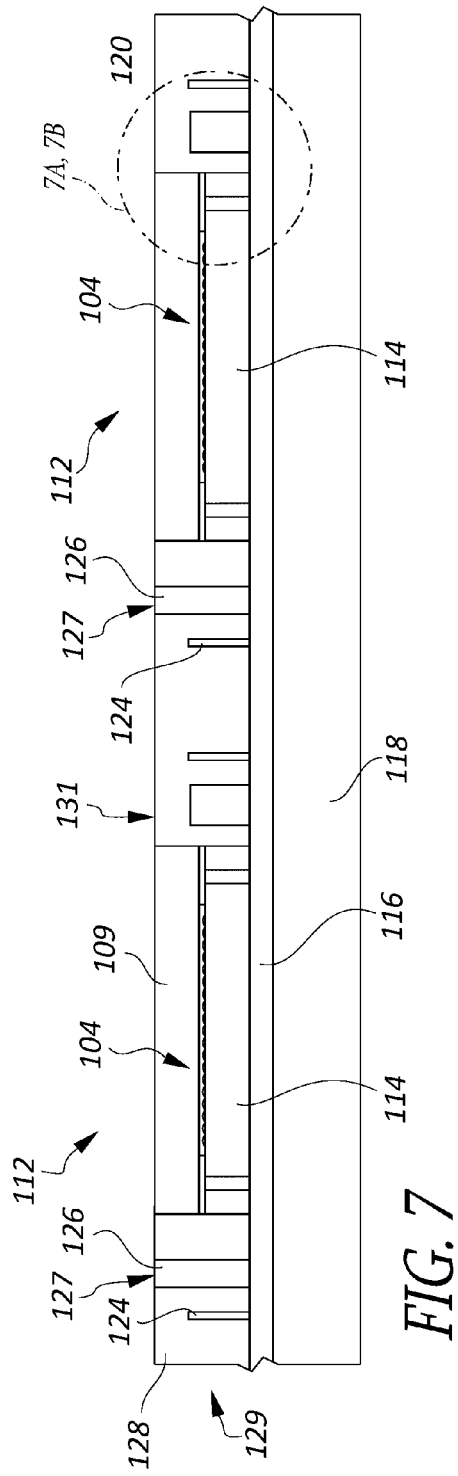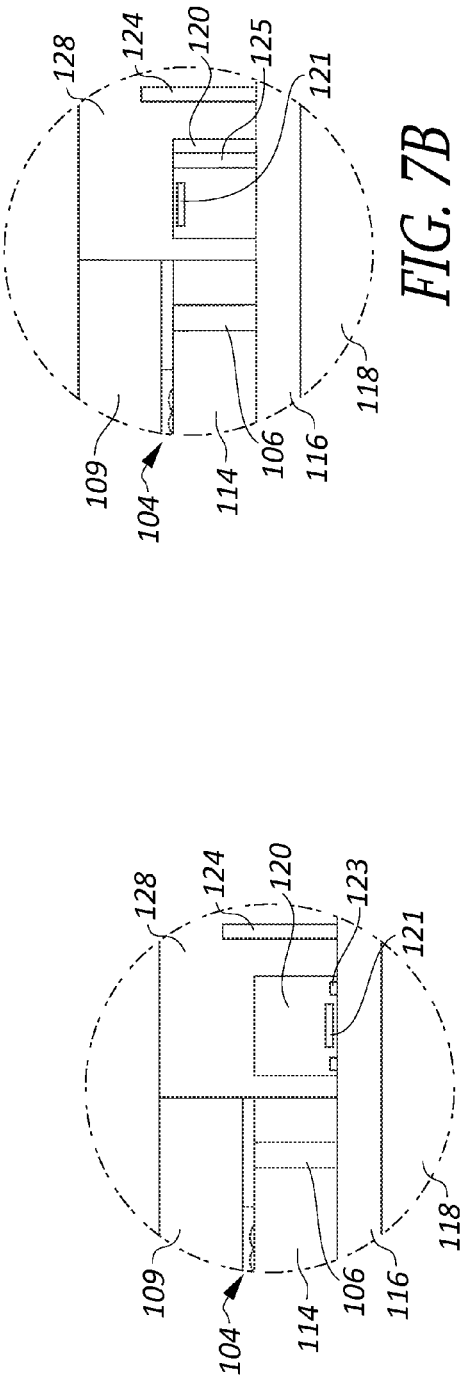

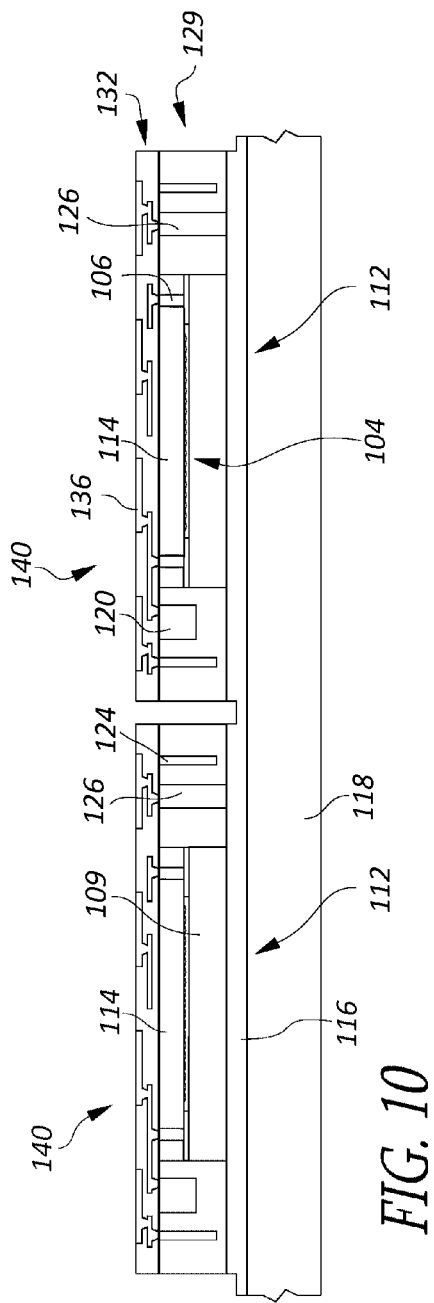
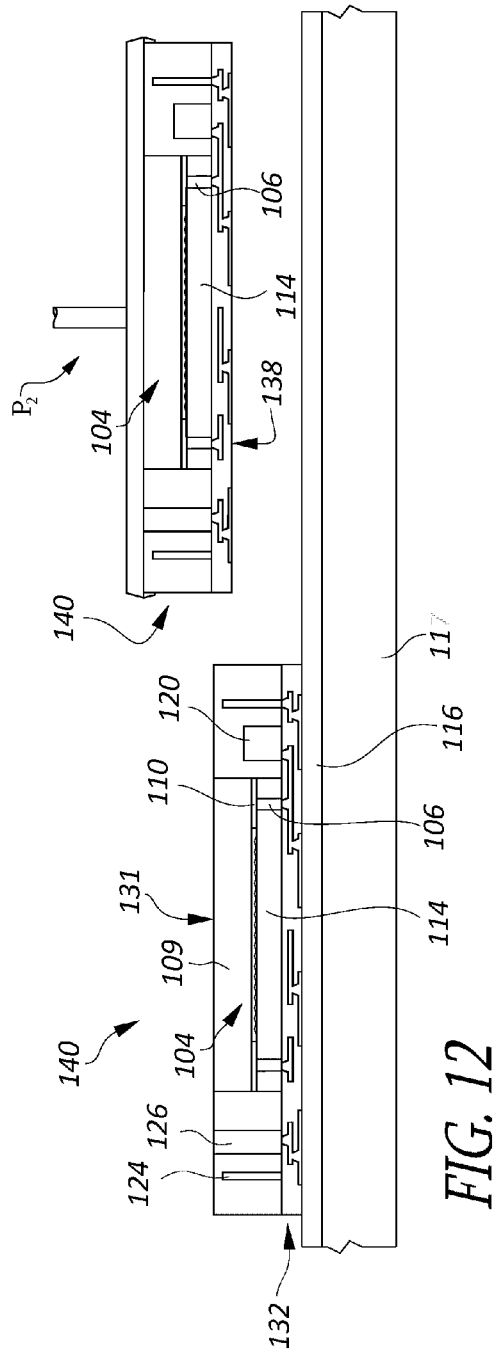
FIG. 10
FIG. 12

OPTICAL SENSOR PACKAGE WITH THROUGH VIAS

BACKGROUND

1. Technical Field

Embodiments of the present invention are directed to a wafer-level package for an optical sensor device, and in particular to a package in which a sensor assembly is embedded in a molding compound layer, and also to a camera module that includes such a package.

2. Description of the Related Art

A challenge that designers face with respect to coupling the optical sensor to a camera circuit is that the device must be positioned on a substrate with the optical sensor facing outward, and without any obstructions that would interfere with the reception of an optical image. It is therefore necessary to couple a circuit to contact pads that are not overlying the optical sensor using techniques that are often not compatible with the correct operation of the optical sensor. Additionally, as camera modules are more commonly used in small electronic devices such as cell phones and tablet computers, there is a strong market pressure to reduce the height of the modules so they can be installed in ever thinner devices.

FIG. 1 shows a known camera module 20 with a semiconductor die 22 on which an optical sensor circuit 26 is formed. The die 22 is mounted to a substrate 24 and wirebonds 28 couple the sensor circuit to a circuit in the substrate. A housing 30 covers the semiconductor die 22 and supports a lens barrel 32, which in turn supports a lens array 36 and a glass plate 34. The glass plate 34 commonly includes an infrared wavelength filter coating.

FIG. 2 shows another known camera module 40 that includes a semiconductor die 42 with an optical sensor circuit 26, a glass plate 52, a filter plate 56, and a lens housing 58 with a lens array 60. The semiconductor die 42 includes through-silicon vias (TSV) 48 that couple the sensor circuit 26 to a circuit on a support substrate 46. Legs 62 couple the housing to the underlying support substrate 46, and an array of solder balls 50 are provided to couple the module to a circuit board.

The example of FIG. 1 is problematic because the housing must be high enough and wide enough to accommodate the wirebonds 28, which makes it less desirable for use in small electronic devices because it limits the minimum thickness of such devices.

The example of FIG. 2 is an improvement over the previous example because it eliminates the wirebonds, which enables a more compact structure with a reduced height, meaning that the device in which it is mounted can be thinner than with the device of FIG. 1. Nevertheless, there are some problems associated with the configuration shown in FIG. 2, including the potential for light leaks. These problems and others will be discussed later.

BRIEF SUMMARY

According to an embodiment, a wafer-level camera sensor package is provided, including a semiconductor substrate with an optical sensor on a front surface. TSVs extend through the substrate and provide I/O contact with the sensor from the back side of the substrate. A transparent cover is positioned over the front surface, and the cover and substrate are embedded in a molding compound layer, the front surface of the molding compound layer lying coplanar with the front of the cover, and the back surface lying coplanar with the back of the substrate. Through-silicon vias (TSV)s extend through the substrate and provide I/O contact with the sensor from the back side of the substrate.

According to some embodiments, surface-mounted devices, electromagnetic shielding, and through-wafer-connectors are embedded in the molding compound layer. A redistribution layer is positioned on the back surface of the molding compound layer and includes contact pads for mounting the package to an underlying circuit board, and also includes conductive traces that interconnect the contact pads, TSVs, surface-mounted devices, shielding, and through-wafer connectors.

According to another embodiment, a camera module includes an image sensor package similar to that described above, and also includes a lens assembly that is coupled to the front face of the sensor module. Anisotropic conductive adhesive is positioned on the front of the sensor package to physically and electrically couple the lens assembly to the package.

According to another embodiment, a manufacturing process is provided, which includes coupling a transparent or selectively transparent cover sheet to a front face of a semiconductor wafer on which a plurality of optical sensor circuits are formed. The resulting assembly is then singulated, and each of the dice is embedded in a molding compound layer of a reconstituted wafer, and a redistribution layer is formed on a back face of the reconstituted wafer.

Following the formation of the molding compound layer, the front and/or back faces of the reconstituted wafer are thinned in a planarization process, after which the reconstituted wafer is singulated into reconstituted dice.

According to an embodiment, electronic elements associated with each of the sensor assemblies are also embedded in the molding compound layer According to an embodiment, a semiconductor die is embedded in a molding compound layer with a back face of the die lying in a plane defined by a back face of the molding compound layer. An optical sensor circuit is formed on a front face of the die. A transparent cover is also embedded in the molding compound layer positioned over the front face of the die, with a front face of the cover lying in a plane defined by a front face of the molding compound layer. Lateral dimensions of the transparent cover are substantially coextensive with lateral dimensions of the semiconductor die.

According to an embodiment, a through-wafer connector is embedded in the molding compound layer with a front contact surface lying in the plane defined by the front face of the molding compound layer.

In a related embodiment, a lens assembly is coupled to the front face of the molding compound layer, and has a contact surface coupled to the front contact surface of the through-wafer connector and coupled, via the through-wafer connector, to a redistribution layer on the back face of the molding compound layer.

BRIEF DESCRIPTION OF THE SEVERAL VIEWS OF THE DRAWINGS

FIGS. 3-10 are schematic side views of an optical sensor package at respective stages in the manufacturing process, and include FIGS. 7, 7A and 7B. FIGS. 7A and 7B are enlarged views of a portion of a reconstituted wafer taken at 7A in FIG. 7, showing respective alternate embodiments.

FIG. 12 is a schematic side view of completed optical sensor packages of FIG. 11, taken along lines 12-12, illustrating a step in a manufacturing process of a camera module according to another embodiment.

DETAILED DESCRIPTION

Figure 1:
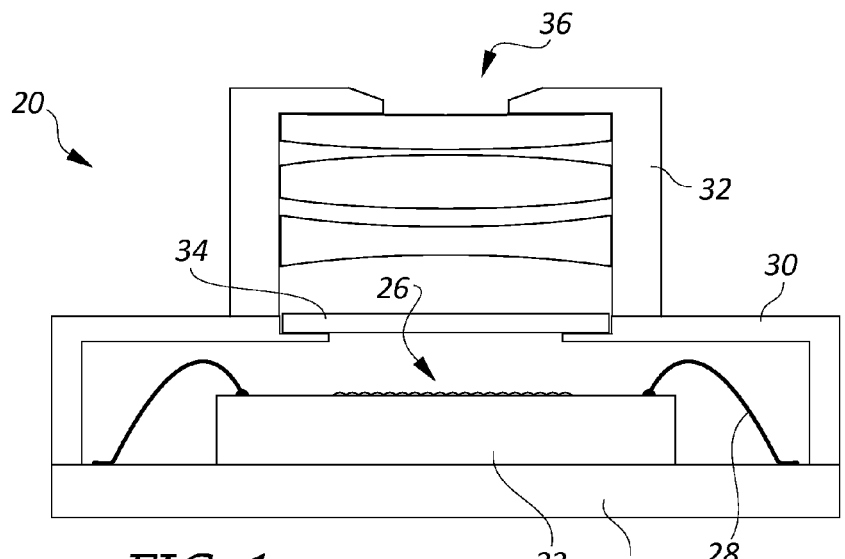
FIGS. 1 and 2 are diagrammatic side views of respective prior art camera modules.
Figure 2:
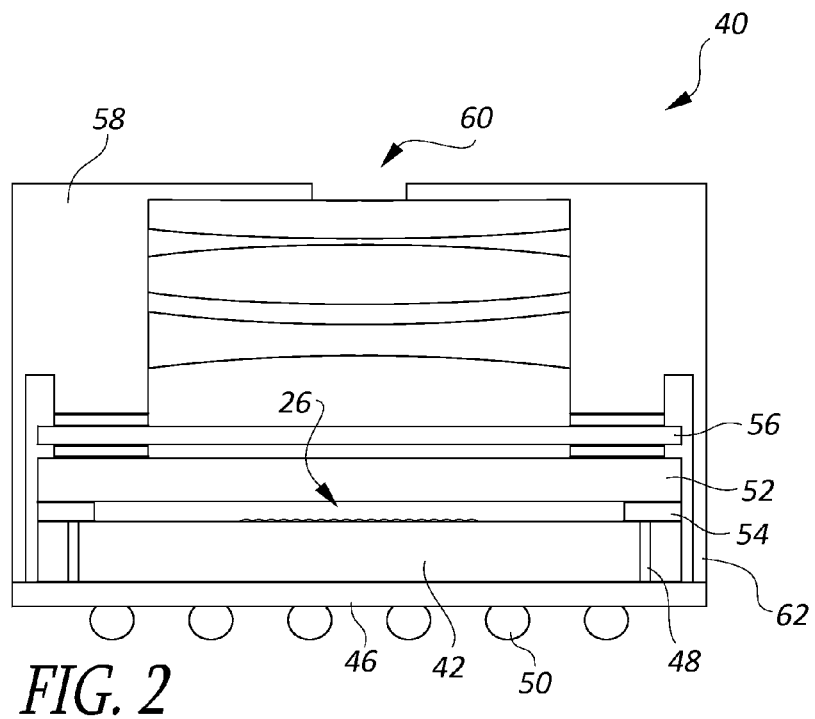

While the prior art example of FIG. 2 has a reduced height, relative to the example of FIG. 1, the inventor has recognized that there are a number of problems that can be associated with the second example. First, the associated semiconductor wafer and glass cover must be thinned to their final thicknesses before the wafer is singulated into individual dice. However, if they are too thin, they become extremely fragile, and can break during singulation. Also, handling of the glass and die assembly by assembly workers or automatic machinery used to assemble the camera module can easily damage them. Additionally, planarity becomes a problem, because the thinned die can be flexed slightly during assembly, resulting in an optical sensor that does not function properly or produces distorted images. Another problem is light leaks. If the lens assembly is not perfectly light tight, or if any light scatter occurs inside the lens assembly, the light can be transmitted from the edge of the cover glass into the image area of the sensor, degrading the image quality. Likewise, in some cases, the through-silicon vias (TSV) can transmit light into the image area from behind the die. Furthermore, there are typically additional elements associated with the camera module that must be separately attached to the circuit board, and that expand the necessary area occupied by the camera and its associated elements. The inventors have therefore created various embodiments that provide advantages that reduce or eliminate the problems discussed above, and also provide further benefits.

A method of manufacturing a wafer level optical sensor package is described with reference to FIGS. 3-11, according to an embodiment. FIGS. 3-10 are side diagrammatical views of an optical sensor package at respective stages in the manufacturing process. A semiconductor wafer 100 is produced, with a plurality of optical sensor circuits 104 formed according to known processes on a front face 102. In the drawings, the structure of an optical sensor, which is well known in the art, is not shown in detail. Instead, an optical sensor circuit is represented by a row of micro-lenses such as are used in many optical sensors. TSVs 106 are formed in the wafer 100, and provide input/output contacts with the sensor from a back side of the wafer 100. An adhesive spacer mask 110 is positioned on the front face of the wafer 100 and includes openings 103 in positions corresponding to each of the plurality of sensors 104.

Devices that are formed on semiconductor material substrates are generally formed on only one surface thereof, and occupy a relatively small part of the total thickness of the substrate. This surface is generally referred to as the active side, or front surface. Therefore, for the purposes of the present disclosure and claims, the terms front and back are used to establish an orientation with reference to the active face of a semiconductor wafer or die. For example, reference to a front surface of some element of an assembly refers to the surface of that element that would be uppermost if the device as a whole were oriented so that the active surface of the die was the uppermost part of the die. Of course, a back surface of an element is the surface that would be lowermost, given the same orientation of the device. Use of either term to refer to an element of such a device is not to be construed as indicating an actual physical orientation of the element, the device, or the associated semiconductor component, and, where used in a claim, does not limit the claim except as explained above.

A transparent material, such as a glass cover 108 is coupled to the front face of the wafer by the adhesive mask 110, with a selected space between the glass cover and the sensor 104 as determined by the thickness of the spacer mask. The glass cover 108 can be provided with a selectively transparent coating on one or more surfaces as is known in the art, such as, for example, an IR or UV coating.

After the glass cover 108 is attached to the wafer 100, the back of the wafer may be thinned or planarized as indicated in FIG. 4 at T, producing a new back face 105. During planarization, the glass cover 108 supports the wafer 100, which permits reducing the wafer to a thinner dimension than would otherwise be possible. Following planarization, the wafer 100 is cut into individual sensor assemblies 112 along kerf Lines K, each assembly having a respective semiconductor die 114, including an optical sensor 104, and an individual glass cover 109.

Figure 5:
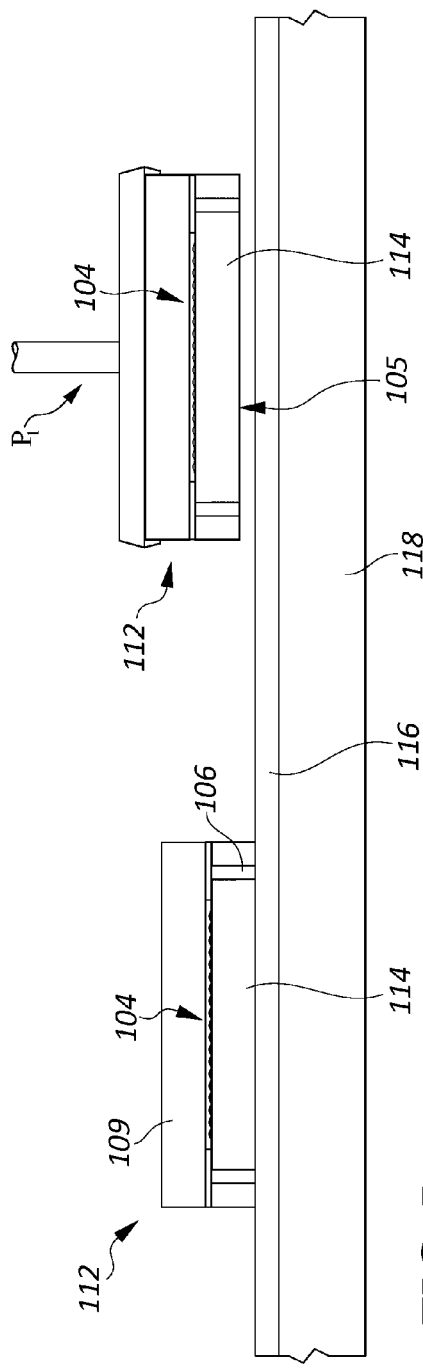
Figure 6:
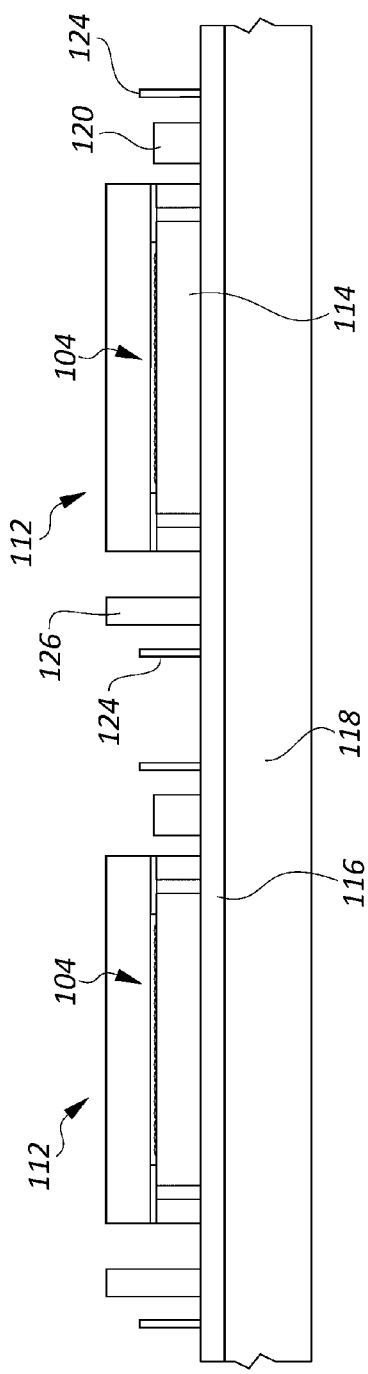

Turning now to FIG. 5, a carrier substrate 118 is provided with a film adhesive layer 116 onto which each sensor assembly 112 is positioned face-up in a pick-and-place operation, as indicated at $P_1$. Following placement of the assemblies 112 on the carrier substrate 118, various additional elements can be positioned on the substrate 118. As shown in FIG. 6, such elements can include surface-mounted devices 120, electromagnetic shield structures 124, and through-wafer-connector elements 126. A surface-mounted device is shown generically to represent any of a number of different kinds of structures that can be included in the package, such as, e.g., passive circuit components like resistors, capacitors, inductors, etc., and additional integrated circuits such as image processors, voltage stabilizers, drivers for lens controls, etc. The electromagnetic shield structures 124 extend around the sensor assemblies 112, as shown in plan view in FIG. 11, and provide shielding from electromagnetic interference. The through-wafer-connector elements 126 will be described in more detail later.

As shown in FIG. 7, a molding compound layer 128 is then deposited on the carrier substrate 118, encapsulating the sensor assemblies 112 and the additional secondary components positioned on the substrate 118 and forming a reconstituted wafer 129. The molding compound layer 128 is formed with a selected thickness so that a front face 131 of the molding compound layer 128 is coplanar with the front face of the glass covers 109. According to an embodiment, the molding compound layer 128 is initially thicker that the assemblies 112, but following curing thereof, is planarized back to the selected thickness. Or, it may be formed by other techniques to this desired thickness, such as using compression molding or a selected amount of molding compound. Furthermore, the glass covers 109 of the dice 112 can be planarized and polished in the same process, further reducing the overall device thickness. Upon completion of the molding compound layer 128, the front face of the glass covers 109 and a contact surface 127 of each of the through-wafer-connector elements 126 is exposed in the front face 131 of the reconstituted wafer 129.

FIGS. 7A and 7B are enlarged views of a portion of the reconstituted wafer 129 at 7A, 7B showing respective alternate embodiments. In particular, in the embodiment of FIG. 7A, the surface-mounted device 120 is a semiconductor die with an integrated circuit 121 formed on a front face. Additionally, a plurality of contact pads 123 are also formed on the front face of the surface-mounted device 120. The die is positioned front-side down on the adhesive film 116, so that when the molding compound layer 128 is formed, the contact pads 123 are exposed on the back face of the reconstituted wafer 129 and accessible for contact as described later. The circuit 121 can be any circuit necessary for proper operation of the sensor circuit 104, or of an associated lens or other associated device.

Referring to the alternate embodiment of FIG. 7B, the surface-mounted device 120 is again a semiconductor die with an integrated circuit 121 formed on its front face. However, the die of FIG. 7B includes a plurality of TSVs 125—only one of which is shown—similar to the TSVs 106 described above. Additionally, the die 120 is positioned back-side down on the adhesive film 116, so that the back face of the die, and the back ends of the TSVs 125 are exposed at the back face of the reconstituted wafer 129.

In the case of the embodiment of FIG. 7A, the exposed contact pads 123 enable direct contact with the circuit 121 so that it can be electrically coupled to the sensor circuit 104 etc., as described below. With regard to the embodiment of FIG. 7B, formation of the TSVs adds expense to the die 120, but it enables thinning of the back side of the reconstituted wafer 129 without damaging or destroying the circuit 121. Thus, the planarization step described with reference to FIG. 4 can be omitted at that stage of the process, and the semiconductor die 114 can retain its full thickness during singulation of the original wafer 100. This reduces the likelihood of damage during singulation. The die 114 can instead be thinned and planarized after the stages described with reference to FIG. 7 or 8, in particular, after formation of the reconstituted wafer 129, so that the die is supported around its lateral edges by the molding compound layer 128 during the planarization and later handling. The front face of the reconstituted wafer can also be thinned as discussed above, reducing the final thickness of the glass cover 109. In the case of the TSVs 106, 125 of the dies 114, 120, which are exposed to planarization after FIG. 7, thinning of the respective die merely shortens the TSVs, without damaging them.

Figure 8:
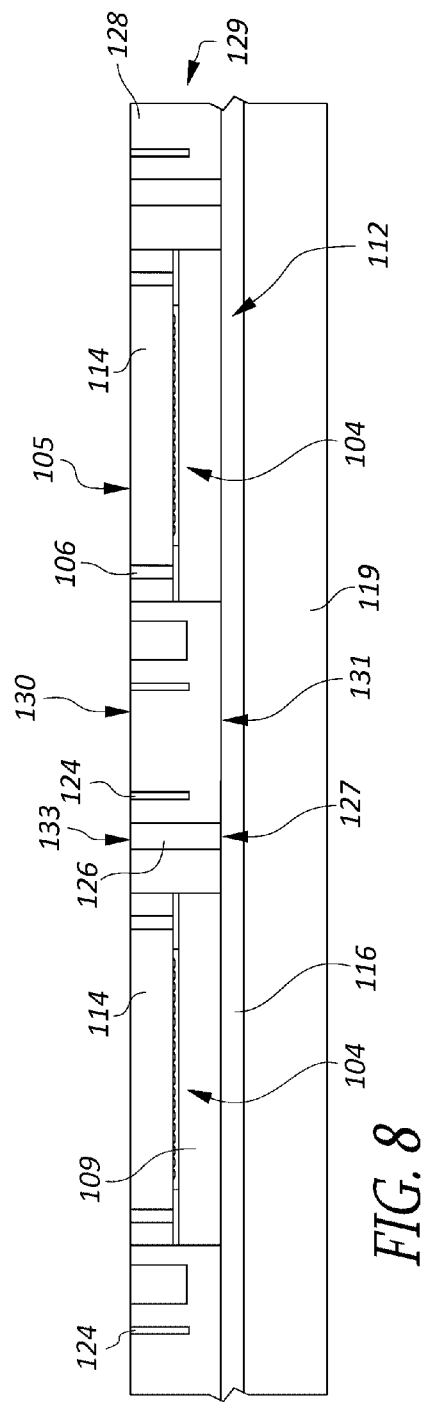

Following completion of the molding compound layer 128, the resulting reconstituted wafer 129 is inverted and placed on another carrier substrate 119, as shown in FIG. 8, so that the front face 131 of the reconstituted wafer 129 is against the adhesive film 116 and a back face 130 of the wafer 129 is accessible. Of course, with respect to any element that was positioned on the adhesive film 116 before formation of the molding compound layer 128, the surface facing the adhesive film will be exposed and coplanar with the back face 130, including, for example, the back faces 105 of the semiconductor dice 114 and the surface-mounted devices 120, the electromagnetic shield structures 124, and the through-wafer-connector elements 126.

In the embodiment shown, each through-wafer-connector element 126 includes a front contact surface 127 and a back contact surface 133 that are exposed in the respective faces of the molding compound layer 128, thereby forming the through-wafer connector 126. According to other embodiments, through-wafer connectors are provided using other known processes, including drilling vias in the cured molding compound layer and filling the vias with a conductive material, etc.

Figure 9:
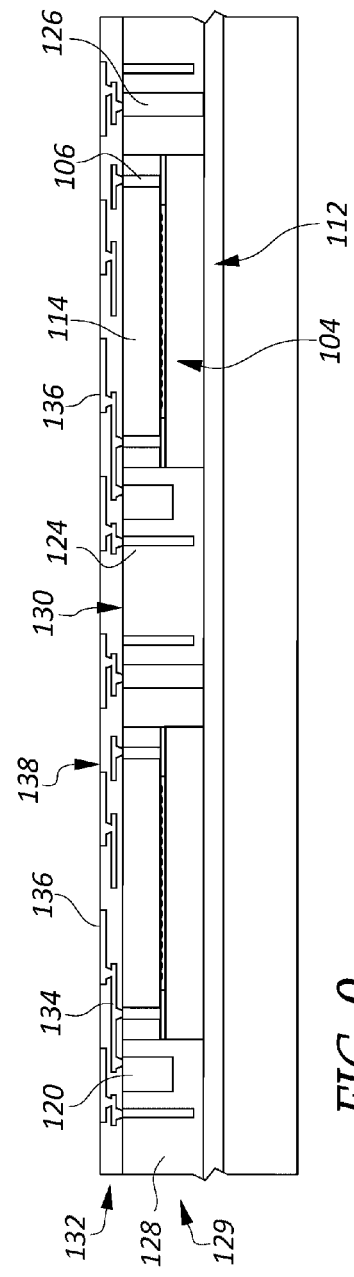

As shown in FIG. 9, a redistribution layer 132 is formed on the back face 130 of the reconstituted wafer 129. The redistribution layer 132 is made in accordance with known principles, and generally includes, for example, electrically conductive traces extending in one or more layers with passivation and dielectric layers providing insulation. Various processes for making redistribution layers are well known in the art, and so will not be described in detail. The redistribution layer 132 of FIG. 9 includes a plurality of contact pads 136 on a back face 138 of the redistribution layer 132 for connection of the image sensor package to a circuit board, and a plurality of electrically conductive traces 134 that interconnect the contact pads 136 with the TSVs 106, surface-mounted devices 120, electromagnetic shields 124, and through-wafer connectors 126.

In the embodiment shown, the contact pads 136 are configured for a land grid array (LGA) surface mount package. Other systems for mounting the package can also be used, including ball grid array, leadless flat pack, etc. LGA and similar mounting systems are advantageous because they permit mounting the package very close to the underlying circuit board, which helps minimize the height of the sensor package and associated lens module, and also because the corresponding circuit board contacts are within the footprint of the package, so the board space that must be dedicated to the package is kept at a minimum.

Turning now to FIG. 10, the reconstituted wafer 129 is sawn into separate wafer-level optical sensor packages 140, each including an optical sensor assembly 112, one or more surface mount devices 120, a shielding structure 124, and one or more through-wafer connectors 126.

Figure 11:
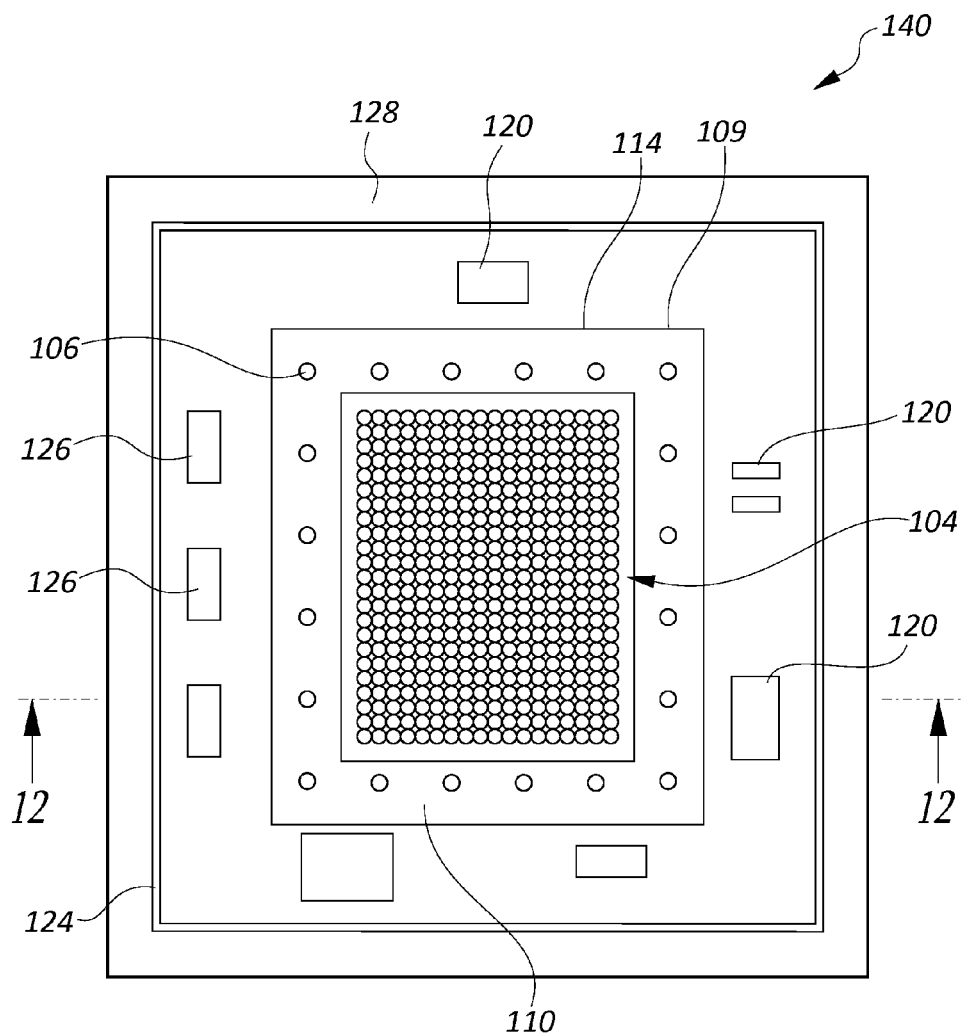
FIG. 11 is a schematic front plan view of a single optical sensor package according to the embodiment of FIGS. 1-10, showing the arrangement of various elements of the package.

FIG. 11 is a schematic front plan view of a single optical sensor package 140, according to an embodiment, showing the arrangement of various elements of the package. For reference, the schematic side view of one of the packages 140 of FIG. 12 corresponds to a cross-sectional view of the package of FIG. 11 taken along lines 12-12. Some of the elements shown in the view of FIG. 11 would not be visible in a physical model of the device, but are shown here to illustrate their relative positions. Other details and elements can be seen with reference to FIG. 12. The package 140 includes an optical sensor assembly 114, a plurality of surface-mounted devices 120, an electromagnetic shield 124, and a plurality of through-wafer connectors 126. The sensor assembly 114, in turn, includes an optical sensor 104, a plurality of TSVs 106 extending through the underlying semiconductor die 112, and an adhesive spacer mask 110, which serves to couple the glass cover 109 to the die while maintaining a selected separation therebetween.

The electromagnetic shield 124 surrounds the sensor assembly 114 and acts to reduce or eliminate electro-magnetic interference that might otherwise affect the image quality of the optical sensor 104. The through-wafer connectors 126 extend through the molding compound layer 128 and are electrically coupled by the redistribution layer 132 to one or more of the surface-mounted devices, the optical sensor 104, and the contact pads 136. Thus, via the through-wafer connectors 126, electrical contact at the front face 131 of the package 140 can be made with selected elements of the package.

While the pictured embodiment of FIG. 11 includes several surface-mounted devices, an electromagnetic shield, and the through-wafer connectors, other embodiments may have more or fewer such secondary components. For example, where no front connection is required, the through-wafer connectors 126 can be omitted. Likewise, the size, shape and number of surface mount devices will certainly vary according to the requirements of each embodiment, and where electromagnetic shielding is not required, it too can be omitted.

Figure 13:
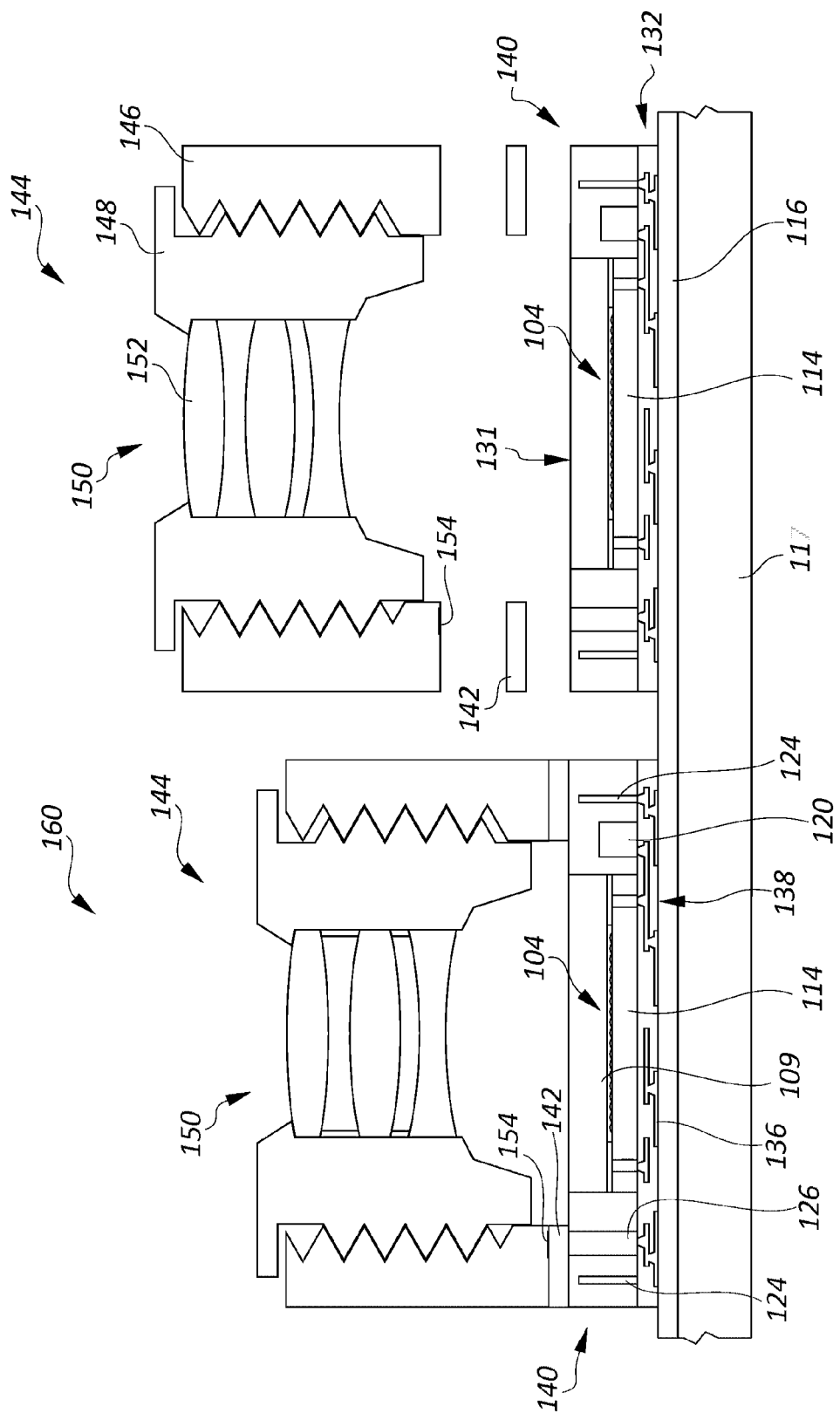
FIG. 13 is a diagrammatical side view illustrating additional steps of the manufacturing process of the embodiment of FIG. 12.

A process for the manufacture of a low-profile camera module that employs an optical sensor package like the package 140 described with reference to FIGS. 3-11, is described below with reference to FIGS. 12 and 13. As depicted at $P_2$ in FIG. 12, each wafer package is positioned front-side-up on a carrier substrate 117, following the singulation process described with reference to FIG. 10. Then, as shown in FIG. 13, an adhesive 142 is positioned on the front face 131 of each optical sensor package 140. A lens assembly 144 is then aligned with the optical sensor package 140 and coupled thereto by the adhesive 142. The lens assembly 144 includes a lens barrel 146, a lens carrier 148, and a lens array 150, which includes one or more lenses 152. The optical sensor package 140 and the lens assembly 144 together comprise a lens module 160, as shown in FIG. 13, and such as might be used in a cell phone or a tablet computer.

Rotation of the lens carrier 148 within the lens barrel 146 changes the Z-axis position of the lens array 150, and thus also changes the focal length of the lens module 160. Although not shown in detail, the lens assembly 144 includes a motor for adjusting the lens, which are well known in the art. The motor is powered and controlled by a signal at a control contact surface 154 on a back face of the lens assembly. Thus, the adhesive 142 is preferably an anisotropic conductive film adhesive. Anisotropic conductive adhesives are formulated to produce an electrical connection along the joining axis, i.e., the Z-axis, while insulating along other axes. For this reason, such adhesives are sometimes referred to as Z-axis adhesives. Here, a control signal is transmitted by the adhesive 142 from the front contact surface 127 of the through-wafer connectors 126 to the control contact surface 154 of the lens assembly 144. Because the Z-axis adhesive does not conduct laterally, multiple connections can be made through the adhesive without producing short circuits. Thus, where the control contact surface 154 of the lens assembly 144 includes a plurality of connectors, and the through-wafer connector 126 of the optical sensor package includes a corresponding plurality of connectors, the Z-axis adhesive 142 can independently coupled each corresponding connector pair.

According to another embodiment, solder connections are provided to electrically and mechanically couple the lens assembly 144 to the optical sensor package 140.

Z-axis adhesives are available as a liquid or paste, and also in the form of a film. Film adhesive is beneficial for use with camera elements because the thickness of the adhesive can be closely controlled, which is useful for controlling planarity and spacing of the lens assembly 144 relative to the optical sensor package 140.

The lens assembly 144 of FIG. 13 is disclosed as having an adjustable focal length. According to other embodiments, the lens assembly is configured to include an adjustable zoom, and/or image stabilization. Such features are well known art and are not showing detail here.

The optical sensor package and camera module disclosed with reference to FIGS. 3-13 provide a number of advantages over the prior art, some of which have already been mentioned. For example, the semiconductor die on which the optical sensor circuit is formed can be thinned to a greater degree than in the prior art. This is because the die can be supported by a relatively thick glass cover or by the molding compound layer during the planarization process. Additionally, because the die is embedded in the molding compound layer before assembly of the camera module, it is more resistant to distortion or damage. In the embodiment disclosed above, the die can be thinned to as little as about 50 μm. In contrast, because the optical sensor of the prior art device of FIG. 2 is supported only by the glass plate during processing and assembly and the combined wafer and glass plate must be at their final thickness before the wafer is singulated into dice, the die cannot be thinned to less than about 300 μm.

Another advantage is that because the sensor die and other associated electronic elements are embedded together in the molding compound layer and electrically coupled by the redistribution layer, the elements can be positioned much more compactly, so that even though the sensor package includes a portion of the molding compound layer, it can occupy less circuit board space than a camera module and associated elements of the prior art. Additionally, the molding compound layer, which is opaque, eliminates the possible sources of light leaks that are often present in the prior art.

Figure 14:
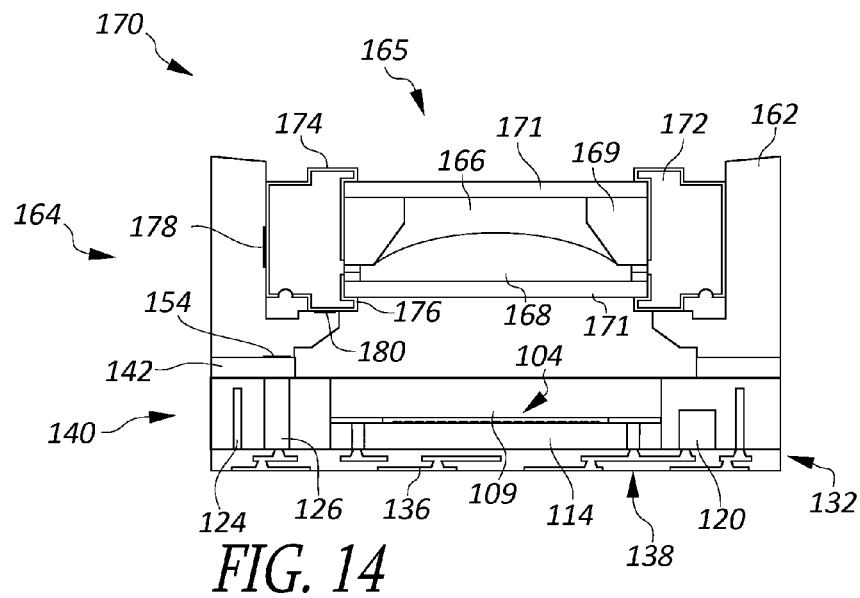
FIGS. 14 and 15 are diagrammatical side views of camera modules according to respective additional embodiments.

Turning now to FIG. 14, a camera module 170 is shown in a side diagrammatical view, according to an embodiment. The camera module 170 includes an optical sensor package 140 substantially as previously described, and a lens assembly 164.

The lens assembly 164 comprises a lens barrel 162 and an electro-wetting lens 165. The electro-wetting lens element 165 operates by control of two immiscible fluids 166, 168. In the example of FIG. 14, the lower fluid 168 is electrically conductive, while the upper fluid 166 is not. The fluids 166, 168 are constrained within a space defined by a side wall 169 and between two glass plates 171 within a lens holder 172. a first electrode 174 places the side wall 169 in electrical contact with a first control contact surface 178 of the lens assembly, while a second electrode 176 places the lower fluid 168 in electrical contact with a second control contact surface 180. The first and second control contact surfaces are in turn coupled to the optical sensor package via the control contact surface 154, the Z-axis adhesive 142, and the though-wafer-connector 126.

When the side wall 169 and the second fluid 168 are placed at opposing electrical potentials, the second fluid is attracted by the side wall, and bulges upward, producing a semi-spherical surface with a reduced radius, altering the focal length. Conversely, if the side wall 169 and the second fluid 168 are placed a same electrical potential, the second fluid is repelled, flattening the curvature of the fluid interface, and changing the focal length in the opposite direction. The principles of electro-wetting lenses are known in the art, including configurations for image stabilization and image zoom. In various alternate embodiments, therefore, the embodiment of FIG. 14 can be modified according to those known principles in order to perform any of those functions.

A lens mount and lens holder configuration that is substantially similar to the structures disclosed with reference to the embodiment of FIG. 14 is described in more detail in U.S. Pat. No. 7,668,449, which is incorporated herein by reference in its entirety.

Figure 15:
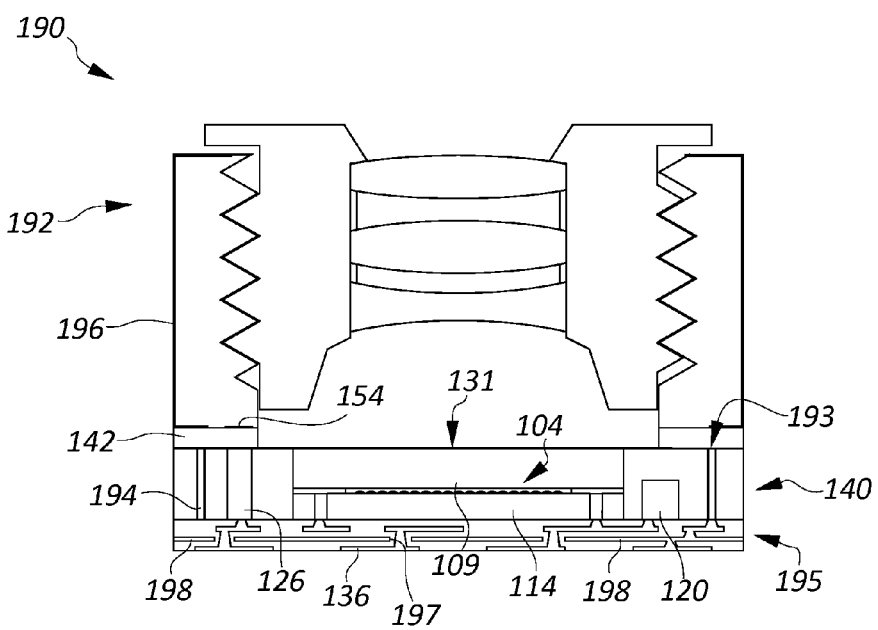

Referring now to FIG. 15, a camera module 190 is shown in accordance with another embodiment. The module 190 includes a lens assembly 191 coupled to an optical sensor package 192. The optical sensor package 192 is substantially similar to the optical sensor package 140 of previous embodiments, except that the electromagnetic shield 194 extends to the front face 131 of the package so that a front surface 193 of the shield is exposed at the front face of the package, and the redistribution layer 195 includes a ground plane 198 that is substantially coextensive with the optical sensor package. Openings 197 provided in the ground plane 198 permit electrically conductive traces 134 to connect other circuit elements with the contact pads 136. Except for the openings 197, the back side of the optical sensor circuit 104 is completely shielded by the conductive ground plane 198. The ground plane is itself coupled to at least one of the contact pads 136 so that it can be coupled to the circuit board ground, and the electromagnetic shield 194 is also coupled to the ground plane.

The lens assembly 191 is substantially similar to the lens assembly 144 of the embodiment of FIG. 13 except that it includes a conductive coating 196 that covers the exterior of the lens barrel 199. It can be seen that the conductive coating 196 extends onto a back face of the lens barrel 199 where it is placed in electrical contact with the exposed surface of the electromagnetic shield 194 by the Z-axis adhesive 142. It can thus be seen that, where in other embodiments an electromagnetic shield is provided that extends laterally around the optical sensor circuit, the optical sensor circuit 104 of the embodiment of FIG. 15 is completely shielded except for directly in front of the circuit. Thus, the camera module 190 can be used in environments in which electromagnetic interference might significantly affect the quality of the image, or in combination with a sensor circuit that is more sensitive to electromagnetic interference. Furthermore, If even more complete electromagnetic shielding is required, the conductive coating can be extended onto the lens holder, and one or more of the lenses can be provided with a conductive coating such as is known in the lens arts. Alternatively, according to other embodiments, the covering can be made to extend only partway up the lens barrel, and/or the coverage of the ground plane can be reduced or omitted, according to the degree of shielding required for the particular application.

The conductive coating 196 can be provided by any appropriate process, such as, for example, by applying a conductive paint to the lens barrel, or by plating the barrel with a conductive metal.

Where the claims recite a contact surface, this is to be read broadly as covering multiple contacts. In other words, for example, where a lens includes a contact surface for controlling a focal length adjustment, it will be understood that such a contact surface might include two separate contacts, for power and ground, or three contacts, for positive power, negative power, and ground, etc.

For the purposes of the present disclosure and claims, redistribution layer is a structure that includes one or more layers of dielectrics and conductors that are formed or deposited on an underlying substrate or layer to create and isolate redistributing signal paths of a semiconductor die and associated elements.

Reconstituted wafers, redistribution layers, through-wafer connectors, and associated processes are described in more detail in the following US patents and patent applications, all of which are incorporated herein by reference in their entireties: Ser. No. 12/651,304, filed Dec. 31, 2009; Ser. No. 12/651,365, filed Dec. 31, 2009; Ser. No. 12/651,392, filed Dec. 31, 2009; Ser. No. 12/977,697, filed Dec. 23, 2010; Ser. No. 13/173,991, filed Jun. 30, 2011; Ser. No. 13/232,780, filed Sep. 14, 2011; Ser. No. 13/287,816, filed Nov. 2, 2011; Ser. No. 13/287,826, filed Nov. 2, 2011, and Ser. No. 13/312,562, filed Dec. 6, 2011.

The term coupled, as used in the claims, includes within its scope indirect coupling, such as when two elements are coupled with one or more intervening elements even where no intervening elements are recited.

In describing the embodiments illustrated in the drawings, directional references, such as right, left, top, bottom, etc., are used to refer to elements or movements as they are shown in the figures. Such terms are used to simplify the description and are not to be construed as limiting the claims in any way.

Ordinal numbers, e.g., first, second, third, etc., are used according to conventional claim practice, i.e., for the purpose of clearly distinguishing between claimed elements or features thereof. The use of such numbers does not suggest any other relationship, e.g., order of operation or relative position of such elements, nor does it exclude the possible combination of the listed elements into a single, multiple-function, structure or housing. Furthermore, ordinal numbers used in the claims have no specific correspondence to those used in the specification to refer to elements of disclosed embodiments on which those claims read.

Terms referring to particular assemblies or combinations of elements, including, for example, optical sensor assembly, optical sensor package, and camera module, are used for convenience, and to simplify the disclosure and claims. Where the claims otherwise read on a particular structure or process, it is not essential that the structure or process in question be clearly separable into the specific sub-assemblies, provided the constituent elements or their equivalents are present as recited.

The term transparent is used herein to refer to elements that are transparent at least to selected wavelengths of light. The term selectively transparent is used to refer to elements that are transparent to selected wavelengths of light, but that are also opaque to other selected wavelengths. For example, a glass cover might be described as being transparent, even if it is opaque to infrared wavelengths, assuming it is transparent to the wavelengths that are of interest and is not being described for use in an infrared imaging system. However, if the cover is selected specifically for its infrared filtering properties, such as in an application where filtering of those wavelengths is beneficial, then it can also be described as being selectively transparent.

The term planarize is used to refer to any process employed to produce a smooth, flat surface, and/or to thin a structure, including chemical and mechanical machining processes, polishing processes, etc.

The term lateral is used to refer to dimensions, positions, or movement of elements in a plane that lies parallel to the front face of an associated semiconductor die or wafer. For example, as represented in any of the drawings excepting FIG. 11, a lateral movement would be a movement along a horizontal axis, i.e., to the left or right, but not in a vertical axis, i.e., toward the top or bottom of the drawings. Because the point of view of FIG. 11 is normal to the front face of the die 114, any movement or dimension that could be depicted in that drawing would be lateral.

The unit symbol "µm" is used herein to refer to a value in microns. One micron is equal to $1 \times 10^{-6}$ meters.

Molding compounds are substances used to encapsulate semiconductor devices in many different packaging processes, are typically composite materials made from blends of ingredients such as, e.g., resins, hardeners, silicas, catalysts, pigments, and release agents, and are generally provided in a substantially liquid form of a selected viscosity so that they can be injected or poured. Molding compounds are available in a very wide range of formulations from different manufacturers and to meet many different criteria. Accordingly, the term molding compound is to be construed broadly to apply to all such compounds.

Where a claim limitation recites a structure as an object of the limitation, that structure itself is not an element of the claim, but is a modifier of the subject. For example, in a limitation that recites "an adhesive configured to receive a lens assembly," the lens assembly is not an element of the claim, but instead serves to define the scope of the term adhesive. Additionally, subsequent limitations or claims that recite or characterize additional elements relative to the lens assembly do not render the lens assembly an element of the claim. On the other hand, a subsequent claim that recites a lens assembly as the subject of a limitation does render the assembly an element thereof.

The abstract of the present disclosure is provided as a brief outline of some of the principles of the invention according to one embodiment, and is not intended as a complete or definitive description of any embodiment thereof, nor should it be relied upon to define terms used in the specification or claims. The abstract does not limit the scope of the claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A camera module, comprising:
a semiconductor die;
an optical sensor circuit positioned on a front face of the die;
a plurality of through-silicon vias extending through the die from the front face to a back face opposite the front face of the die, each of the plurality of through-silicon vias being in electrical contact with the optical sensor circuit on the front face of the die;
a transparent cover coupled to the die over the front face of the die, the transparent cover having a front face and a back face, the back face of the transparent cover facing the front face of the die, lateral dimensions of the transparent cover being substantially coextensive with lateral dimensions of the die;
a molding compound layer in which the die and transparent cover are embedded, a back face of the molding compound layer lying substantially coplanar with the back face of the semiconductor die and a front face of the molding compound layer lying substantially coplanar with the front face of the transparent cover;
a redistribution layer extending over the back face of the molding compound layer and the back face of the semiconductor die, the redistribution layer having a plurality of contact pads on a back face thereof, and a plurality of electrically conductive traces interconnecting selected combinations of ones of the plurality of through-silicon vias and ones of the plurality of contact pads; and
a packaged electrical device having a surface located on the redistribution layer, the packaged electrical device being embedded in the molding compound layer.

2. The camera module of claim 1, wherein the packaged electrical device is directly electrically coupled to the optical sensor circuit through the redistribution layer.

3. The camera module of claim 2 wherein the passive electronic component embedded in the molding compound layer is electrically coupled to the optical sensor circuit through one of the plurality of through-silicon vias.

4. The camera module of claim 1 wherein a back surface of the packaged electrical device is embedded in the molding compound layer, and the packaged electrical device is coupled to one or more of the plurality of electrically conductive traces.

5. The camera module of claim 4 further comprising an electromagnetic shield extending around the optical sensor assembly.

6. The camera module of claim 1, comprising a through-wafer connector embedded in the molding compound layer and having a first contact surface lying in a plane defined by the back face of the molding compound layer and a second contact surface exposed at the front face of the molding compound layer.

7. The camera module of claim 1 wherein the front faces of the molding compound layer and the transparent cover define a front face of an optical sensor package.

8. The camera module of claim 1, comprising an anisotropic conductive adhesive positioned on the front face of the molding compound layer and configured to place a lens assembly in electrical contact with one or more contact surfaces exposed at the front face of the molding compound layer.

9. The camera module of claim 1, comprising a lens assembly coupled to a front face of an optical sensor package, defined by the front faces of the molding compound layer and the transparent cover.

10. The camera module of claim 9, comprising a through-wafer connector having a front contact surface exposed at the front of the molding compound layer, and wherein the lens assembly comprises a control contact surface facing the optical sensor package, and the control contact surface of the lens assembly is electrically coupled to the through-wafer connector.

11. The camera module of claim 10 wherein the lens assembly includes one or more of: an adjustable focal length controllable by a signal at the control contact surface, an adjustable zoom controllable by a signal at the control signal connector an image stabilizer mechanism controllable by a signal at the control contact surface, an electrowetting lens controllable by a signal at the control contact surface.

12. The camera module of claim 9 wherein the lens assembly comprises an electromagnetic shield with a shield contact surface facing the optical sensor package, and wherein the shield contact surface is electrically coupled to an electromagnetic shield of the optical sensor package via a front contact surface of the optical sensor package.

13. The camera module of claim 1 wherein the packaged device is one a resistor, capacitor, and inductor.

14. The camera module of claim 1 wherein the packaged device is one of an image processor, voltage stabilizer, and driver.

15. A camera module, comprising:
a reconstituted die including:
a molding compound layer;
a semiconductor die embedded in the molding compound layer with a back face of the die lying in a plane defined by a back face of the molding compound layer, the semiconductor die having an optical sensor circuit formed on a front face thereof;
a transparent cover embedded in the molding compound layer with a front face of the cover lying in a plane defined by a front face of the molding compound layer, the cover being positioned over the front face of the die, lateral dimensions of the transparent cover being substantially coextensive with lateral dimensions of the semiconductor die;

a redistribution layer formed on the back face of the reconstituted die and as surface of the molding compound layer;

a plurality of through vias extending through the semiconductor die and placing electrical traces of the redistribution layer in electrical contact with the optical sensor circuit on the front face of the die; and at least one packaged passive component embedded in the molding compound layer, the at least one packaged passive component being electrically coupled to the optical sensor circuit through one of the plurality of through vias and one of the electrical traces of the redistribution layer.

16. The camera module of claim 15, wherein the packaged passive component is one of a capacitor, inductor, and a resistor.

17. The camera module of claim 16, comprising:

a through-wafer-connector extending through the molding compound layer;

a lens assembly coupled to the front face of the reconstituted die, the lens assembly having a contact surface on a back face electrically coupled to a front contact surface of the through-wafer connector and coupled, via the through-wafer connector, to the redistribution layer on the back face of the reconstituted die.

* * * * *